United States Patent [19]

Yamaura et al.

[11] 4,314,199
[45] Feb. 2, 1982

[54] METHOD FOR LOCATING A FAULT POINT ON A TRANSMISSION LINE

[75] Inventors: Mitsuru Yamaura, Hachioji; Yukinari Yamakoshi, Machida, both of Japan

[73] Assignee: Tokyo Shibaura Denki Kabushiki Kaisha, Kawasaki, Japan

[21] Appl. No.: 87,771

[22] Filed: Oct. 24, 1979

[30] Foreign Application Priority Data

Oct. 30, 1978 [JP] Japan .................. 53-132575

[51] Int. Cl.³ ........................... G01R 31/08
[52] U.S. Cl. ................................ 324/52
[58] Field of Search .............. 324/52; 361/80–82, 361/79

[56] References Cited

U.S. PATENT DOCUMENTS 4,063,300  12/1977  Paddison et al. ........... 361/80
4,251,766   2/1981  Souillard ................ 361/80 X

FOREIGN PATENT DOCUMENTS 52-40746  3/1977  Japan .................. 324/52
53-67838  6/1978  Japan .

OTHER PUBLICATIONS

Westlin et al., Newton-Raphson Technique Applied to the Fault Location Problem IEEE Paper No. A763-34-3, Apr. 26, 1976, pp. 1-6.

Primary Examiner—Gerard R. Strecker
Attorney, Agent, or Firm—Oblon, Fisher, Spivak, McClelland & Maier

[57] ABSTRACT

A fault component current is obtained in response to a fault at a fault point within a protective section on a transmission line at one end of the protective section. Assuming that a phase difference between the fault component current and a fault point current flowing through the fault point is known, the fault point current is obtained on the basis of the fault component current and the phase difference. Then, a voltage at an assumed fault point is obtained by using voltage and current at the one end of the protective section and the line constants of the protective section. An assumed fault point is then obtained to permit the voltage at the assumed fault point to be in phase with the fault point current. The assumed fault point is assumed to be a true fault point.

7 Claims, 14 Drawing Figures

FROM A-D CONVERTER 12 IN FIG. 5

↓

CALCULATE FAULT COMPONENT CURRENT $I_D$ FROM EQUATION 5 — 1

↓

CALCULATE FAULT POINT CURRENT $I_F$ FROM EQUATION 6 — 2

↓

CALCULATE FAULT POINT DISTANCE X FROM EQUATION 20', Θ BEING CONSTANT — 3

FIG. 9B

FROM A-D CONVERTER 12 IN FIG. 5

↓

CALCULATE FAULT COMPONENT CURRENT $I_D$ & FAULT COMPONENT VOLTAGE $V_D$ FROM EQUATION 16 — 1

↓

CALCULATE ASSUMED FAULT POINT CURRENT $I_f$ FROM EQUATION 14 — 2

↓

CALCULATE FAULT POINT DISTANCE X FROM EQUATION 21' OR 22', Θ BEING KNOWN — 3

METHOD FOR LOCATING A FAULT POINT ON A TRANSMISSION LINE

The invention relates to a method for locating a fault point on a transmission line within a given protective section by using a voltage or current at one end of the protective section. More particularly, the invention relates to a method for locating a fault point without being affected by a resistance at the fault point and a current flowing from the other end of the protective section into the fault point.

The fault point locating method according to the invention is applied for a transmission line including a power transmission line or a power distribution line. To locate a fault point on a power transmission line, known distance relays are conventionally used, which measures a distance from one end of a given protective section over the power transmission line on the basis of the following principle. The details of the principle follows. In an equivalent circuit of a power transmission line shown in FIG. 1, distance relays are connected to first and second terminals S and R, respectively, and a protective section protected by the relays is defined by the terminals S and R. In the circuit, $V_S$ and $V_R$ designate back power sources connected to the terminals S and R; L and r line constants, that is, an inductance and a resistance per unit length; F a fault point on the power transmission line; X a distance between the first terminal S and a fault point F.

Figure 1:
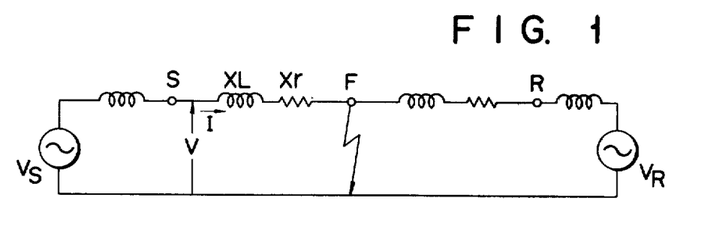
FIG. 1 shows an equivalent circuit of a power transmission line when the power transmission line is fully shortcircuited at a part.

The equivalent circuit shown in FIG. 1 represents a situation that a fault point F is fully shortcircuited, that is to say, resistance at the fault point F is zero. In this situation, the following equation (1) holds $$V - X(j\omega L + r)I = 0 \quad (1)$$

where V is a voltage at the terminal S, I a current flowing through the terminal S in an arrow direction, and $\omega$ an angular frequency. In the equation (1), V and I are measured at the first terminal S, and $\omega L$ and r are already known. Accordingly, a distance X may be calculated by using the equation (1).

Figure 2:
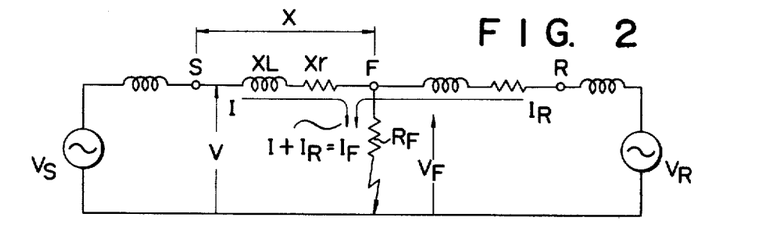
FIG. 2 shows an equivalent circuit of a power transmission line when the power transmission line is insufficiently shortcircuited at a part.

Another equivalent circuit shown in FIG. 2 is depicted when the fault point F is insufficiently shortcircuited, that is to say, the fault point F has a fault point resistance $R_F$. In this situation, the following equation holds $$V - X(j\omega L + r)I - R_F(I + I_R) = 0$$

Rearranging this, we have $$V/I - Xj\omega L - (Xr + R_F) - R_F I_R/I = 0 \quad (2)$$

where $I_R$ is a current from the second terminal R of the S-R protective section into the fault point F. In the equation (2), if the ratio $I_R/I$ is sufficiently small, an imaginary part of V/I approximates to $X\omega L$. Accordingly, in such a situation, the distance X may be calculated. The foregoing is the principle of the known distance measuring method by reactance.

As known, in the distance measuring method, if $I_R/I$ is insufficiently small, the distance X includes an error corresponding to an imaginary part component of $R_F I_R/I$. Due to this error, the measuring method is impracticable for locating a fault point F, as known. In the case of the distance relay, it is not necessary to strictly locate the fault point F. Accordingly, in locating a fault point F, a range in which the fault point exists is discriminated by previously estimating an error corresponding to the imaginary part component. It is for this reason that, in order to detect a location of a fault point within the protective section (S-R section), an operating range of the distance relays must be set up narrower than the protective section.

Accordingly, an object of the invention is to provide a method for reliably locating a fault point within a protective section on a transmission line irrespective of a value of the ratio of a current flowing from the second terminal of the protective section into a fault point to a current flowing from the first terminal of the protective section to the fault point.

According to one aspect of the invention, there is provided a method for locating a fault point on a transmission line which comprises: a first step for detecting a prefault current (first current) at one end of the transmission line and detecting a faulted voltage and a faulted current (second current) at said one end; a second step for subtracting the prefault current (first current) from the faulted current (second current) to obtain a fault component current at said one end; a third step for shifting the phase of the fault component current by a known phase angle to obtain a third current; a fourth step for assuming an assumed fault point, subtracting an impedance voltage drop from the faulted voltage to obtain an assumed fault point voltage at the assumed fault point, the impedance voltage drop being a voltage drop caused by the faulted current (second current) between the one end and the assumed fault point; and a fifth step for discriminating whether the phase of the assumed fault point voltage coincides approximately with the phase of the third current obtained in the third step or not, changing the assumed fault point, repeating the fourth step and the discriminating step until the phase of the assumed fault point voltage coincides approximately with the phase of the third current, and determining the assumed fault point at which the phase of the assumed fault point voltage coincides approximately with the phase of the third current to be the fault point.

Other object and features of the invention will be apparent from the following description taken in connection with the accompanying drawings, in which.

Figure 3:
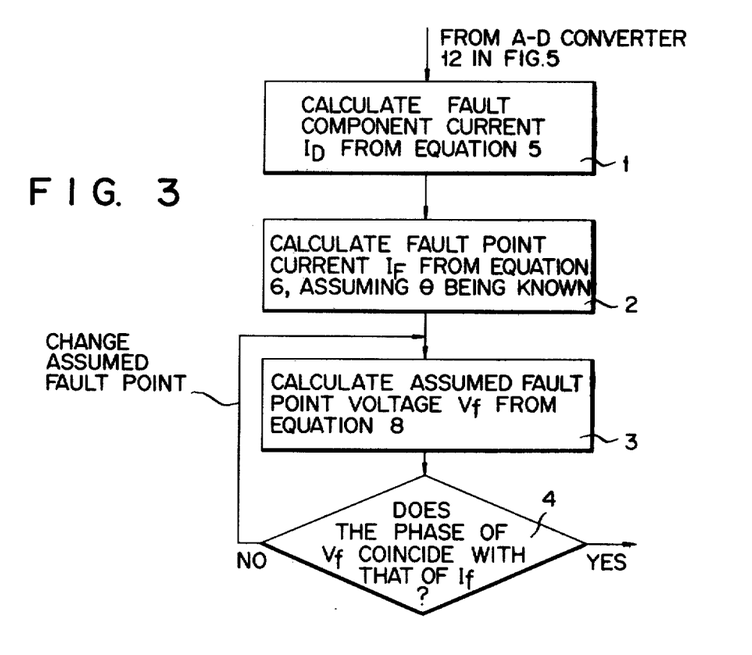
FIG. 3 shows a flow chart useful in explaining the operation of an embodiment of a method for locating a fault point on a transmission line according to the invention.

A first embodiment of a method for locating a fault point on a transmission line according to the invention will be described with reference to FIGS. 3, 4A 4B and 5. FIG. 3 shows a flow chart to illustrate the operation of the first embodiment. In FIG. 3, reference numeral 1 designates a first step for obtaining a fault component current $I_D$ flowing through one end or a first end S of a protective section of a power transmission line; 2 designates a second step for obtaining a fault point current $I_F$ flowing through a fault point F; 3 a third step for obtaining an assumed fault point voltage $V_f$ at an assumed fault point f within the protective section; 4 a fourth step for checking if a phase of the fault point current $I_F$ and a phase of a voltage $V_f$ at the assumed fault point f are almost in phase or not. At the 4th step 4, if the phase of the fault point current $I_F$ and the phase of the voltage $V_f$ at the assumed fault point f are not in phase, as denoted as "NO", the operation returns to the 3rd step where the assumed fault point f is displaced, and the check operation in the 4th step 4 is repeated. Through this fault point locating operation, if the phases of the fault point current $I_F$ and the voltage $V_f$ at the assumed fault point f are approximately coincident with each other, the 4th step provides "YES" to complete the check operation. The details of the respective steps mentioned above will be described with reference to FIGS. 4A and 5.

Figure 4A:
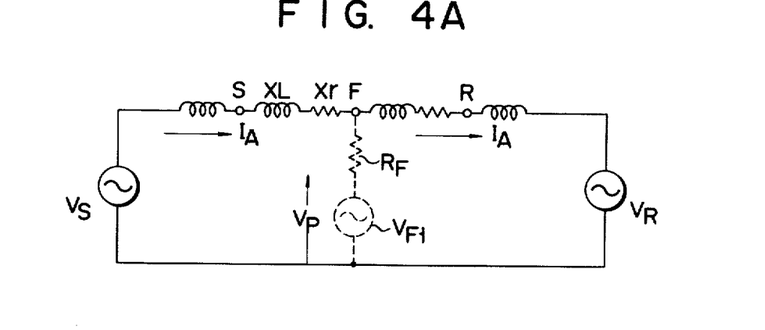
FIGS. 4A and 4B show equivalent circuits of transmission lines useful in explaining the principle of the method for locating a fault point according to the invention.
Figure 4B:
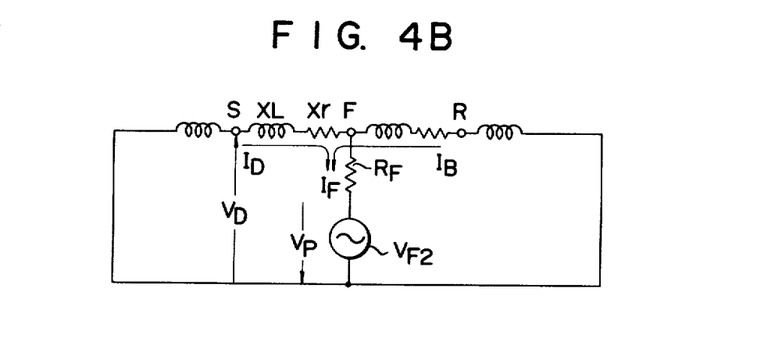

The equivalent circuit shown in FIG. 2 may be separated into an equivalent circuit before fault occurrence (FIG. 4A) and an equivalent circuit having fault components (FIG. 4B) by using the principle of superposition. In FIGS. 4A and 4B, like reference symbols are used to designate like portions in FIG. 2. The circuit shown in FIG. 4A represents a circuit condition when no fault occurs. In the circuit, current $I_A$ flows one end S to the other end R. A power source $V_{F1}$ is connected through a fault point resistor $R_F$ between a fault point F and ground. The voltage of the power source $V_{F1}$ is equal to an open voltage at point F and has a voltage $V_p$ with polarities as shown. Current flowing through the fault point resistor $R_F$ is zero. A portion indicated by dotted line in the figure is presumably present. FIG. 4B shows an equivalent circuit of fault components on a transmission line. The circuit illustrates states of the fault component voltage and current. As shown, a power source $V_{F2}$ supplying a voltage opposite in polarity to that of voltage $V_p$ shown in FIG. 4A is connected through a fault point resistor $R_F$ to the fault point F. The terminal S feeds a first fault component current $I_D$ into the fault point F and the terminal R feeds a third fault component current $I_B$ into the fault point F. When the circuits shown in FIGS. 4A and 4B are superposed, the principle of superposition allows it to be depicted as shown in FIG. 2. The equation (3) holds among the currents I (FIG. 2), $I_A$ (FIG. 4A), and $I_D$ (FIG. 4B).

$$I = I_A + I_D \tag{3}$$

If the fault point current is designated by $I_F$, we have
$$I_F = I + I_R = I_D + I_B \tag{4}$$

In the step 1 in FIG. 3, the fault component current $I_D$ is obtained by using the following equation (5)

$$I_D = I - I_A \tag{5}$$

In the step 2 shown in FIG. 3, a current in phase with the fault point current $I_F$ is obtained. As seen from the operation (4), to obtain the fault point current $I_F$, the fault component current $I_B$ (referred to as a third fault component current) flowing from the end R into the fault point F is needed. In the invention, however, the fault point F is searched by using only a measuring point at the end S and thus the following equation is used $$I_F = \lambda \cdot I_D \cdot e^{j\theta} \tag{6}$$

where $\lambda$ is an unknown real quantity, $\theta$ is a known phase difference (a phase difference between the currents $I_F$ and $I_D$) determined depending on a position of the fault point F. Rewriting the equations (4) and (6), we have $$\left.\begin{array}{l} I_F = I_D(1 + I_B/I_D) = \lambda I_D e^{j\theta} \\ \lambda = |1 + I_B/I_D| \\ \theta = \arg(1 + I_B/I_D) \end{array}\right\} \tag{7}$$

As seen from the equation (7), if the fault point F is known, $\theta$ can be obtained. Normally, the currents $I_B$ and $I_D$ are almost in phase and hence $\theta$ takes a value approximate to zero. Therefore, in the step 2, under a condition $\theta = 0$, the current $I_F$ may be obtained.

In the step 3 in FIG. 3, on the assumption that a fault point is at point f (not shown), an assumed fault point voltage $V_f$ at the assumed fault point f is calculated. Assume now that a distance from the terminal S to the assumed fault point f is X. A voltage $V_f$ at the assumed fault point f is expressed by the following equation $$V_f = V - I(j\omega L + r)X \tag{8}$$

Then, the step 4 checks whether the fault point current $I_F$ [equation (6)] and the voltage $V_f$ [equation (8)] at the assumed fault point f are in phase or not. In order that the assumed fault point f and the fault point F are coincident with each other, the following equation (9) must hold $$V_f = R_F I_F \tag{9}$$

Hence, the current $I_F$ and the voltage $V_F$ must be in phase. It is for this reason that, when the step 4 provides "YES" indicating that $I_F$ and $V_F$ are almost in phase, the operation shown in FIG. 3 is completed. On the other hand, if the step 4 provides "NO" indicating that $I_F$ and $V_F$ are not in phase, the operation returns to the step 3 where a new assumed fault point f is processed through the steps 3 and 4 to finally obtain the fault point F.

As seen from the above description, the third current described in the third step of the one aspect of this invention may be obtained by shifting the phase angle of the fault component current $I_D$ by a known phase angle, that is, obtaining $I_F/\lambda$. Accordingly, to obtain the third current, it is required that $\theta$ [(6) or (7)] is known irrespective of the fault point resistance $R_F$ or $|1+I_B/I_D|$ (7). As described above, $\theta$ normally approximates to zero and is almost invariable with respect to a location of the fault point F. For this reason, it is easy to previously set a value of $\theta$. In this respect, the present invention is very useful in this field.

Figure 5:
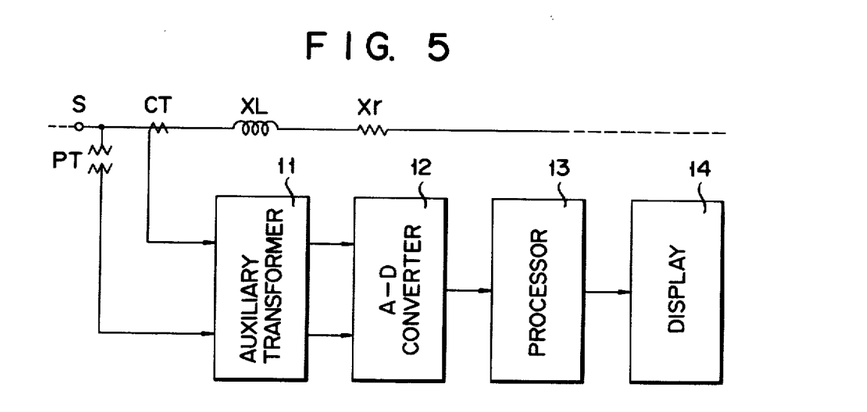
FIG. 5 shows a block diagram of a device for realizing the embodiments according to the invention.

FIG. 5 shows an example of a device to execute the flow of operation shown in FIG. 3 and also applicable for the embodiments of the invention to be described later. In FIG. 5, symbols S, XL and Xr designate the same portions shown in FIG. 1. CT designates a current transformer and PT a voltage transformer. Reference numeral 11 denotes an auxiliary transformer for converting the secondary current of the current transformer CT and the secondary voltage of the voltage transformer PT, which are inputted thereinto, into given voltage levels. An A/D converter 12 A-D converts an output of the auxiliary transformer 11. A processor 13 processes at a predetermined manner an output of A/D converter 12. A display unit 14 displays the result of the processing of the processor 13. The A/D converter 12 is attended with a sampling holder, a multiplexer to switch an input to the A/D converter and the like, if necessary. Further, a filter to remove high harmonic components may be placed at the prestage of the sampling holder. All steps in FIG. 3 are executed in the processor 13. The output of the A/D converter 12 corresponds to an instantaneous value of an input quantity thereto. Incidentally, the various electrical quantities in the equations (1) to (8) are vector quantities. Accordingly, to execute the calculations (1) to (8) by the processor 13, the vector calculation must be performed by using the instantaneous values. Such a vector operation can be performed by using various known methods. The display 14 may be a printer to print the calculation results or a transmission device to transmit the calculation result to given locations.

Figure 6:
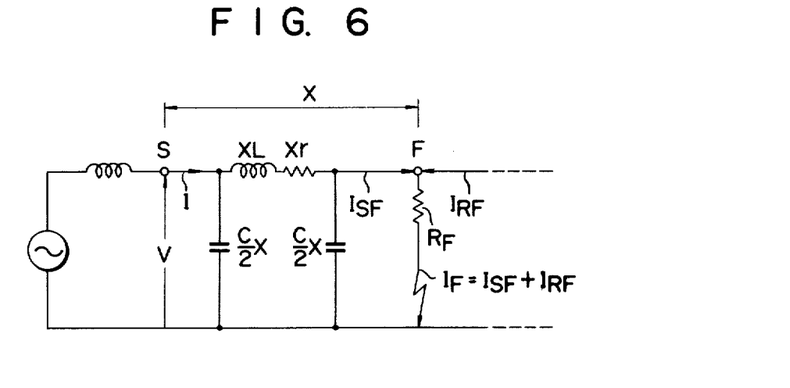
FIG. 6 shows an equivalent circuit diagram of a power transmission line when the distributed capacitances thereof are taken into consideration.

The fault point finding method according to the invention is applicable for a case where a consideration is given to distributed capacities of a power transmission line. An equivalent circuit in such a case is illustrated in FIG. 6, and corresponds to the circuit of FIG. 2 with additional π-type circuit representing the distributed capacities. To be more specific, a capacitance per unit distance of the transmission line is denoted as C and half of the whole capacitance, i.e. ½CX, is inserted between the terminal S and ground, and between the fault point F and ground. In the circuit, a section between the fault point F and the end R of the protective section is not illustrated for simplicity. As shown in FIG. 6, a current I flowing through the end S is not equal to a current $I_{SF}$ flowing into the fault point F. When the current flowing from the end R into the fault point F is $I_{RF}$, the fault point current $I_F$ is expressed by $$I_F = I_{SF} + I_{RF} \tag{10}$$

Figure 7A:
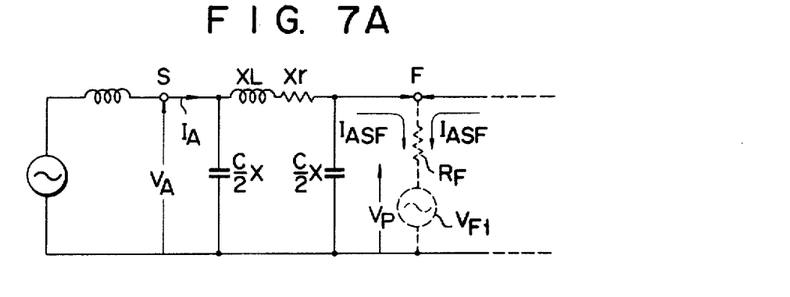
FIGS. 7A and 7B show equivalent circuits useful in explaining the principle of the present invention according to FIG. 6.
Figure 7B:
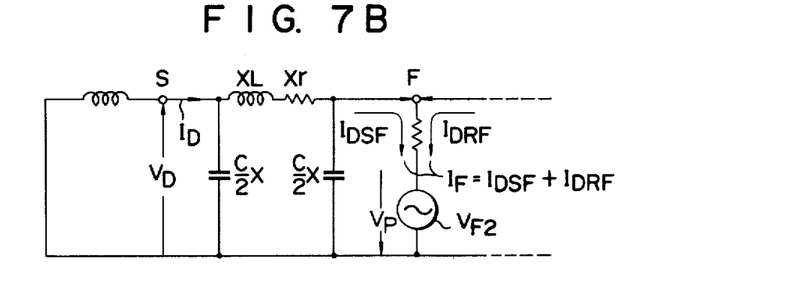

The equivalent circuit shown in FIG. 6 also may be separated into two circuits as shown in FIGS. 7A and 7B, as in the case of FIG. 2. As in FIG. 4A, the circuit shown in FIG. 7A indicates a circuit condition before a fault takes place. As shown, an assumed fault point resistor $R_F$ and a power source $V_{F1}$ are inserted between the fault point F and ground, and a current flowing into the resistor $R_F$ is zero, as in the case of FIG. 4A. The equivalent circuit shown in FIG. 7B illustrates conditions of fault component currents and voltages. The circuits shown in FIGS. 7A and 7B are combined to be the equivalent circuit shown in FIG. 6, by the principle of superposition.

In FIGS. 6, 7A and 7B, the voltage and current at the end S before fault occurrence are designated by $V_A$ and $I_A$, respectively and the voltage and current of the fault component are designated by $V_D$ and $I_D$, respectively. Further, the current flowing into the fault point F from the end S before fault occurrence and the fault component current flowing into the fault point from the end S at fault occurrence are designated by $I_{ASF}$ and $I_{DSF}$, respectively. Still further, the current flowing into the fault point F from the end S before fault occurrence and the fault component current flowing into the fault point F from the end R at fault occurrence are designated by $I_{ASF}$ and $I_{DSF}$, respectively. Moreover, in FIG. 6, the current flowing from the end S into the fault point F is designated by $I_{SF}$ and the current flowing from the end R into the fault point F is designated by $I_{RF}$. Under this condition, the voltages and currents shown in FIGS. 6, 7A and 7B are related by the following equation (11)

$$\left.\begin{array}{l} V = V_A + V_D \\ I = I_A + I_D \\ I_F = I_{SF} + I_{RS} = I_{DSF} + I_{DRF} \end{array}\right\} \tag{11}$$

Here, $I_D$, $I_{DSF}$ and $I_{DRF}$ are referred to as first, second and third fault component currents, respectively. In the equation (11), $I_F$, $I_{DSF}$ and $I_{DRF}$ can not be obtained unless a fault point is presumed. For this, assume that an assumed fault point current at an assumed fault point f is $I_f$, an assumed second fault current is $I_{DSf}$ and an assumed third fault current is $I_{DRf}$. Those currents are related as follows:

$$I_f = I_{DSf} + I_{DRf} \tag{12}$$

In the equation (12), $I_{DSf}$ may be expressed by the equation (13).

$$I_{DSf} = I_D - j\omega \frac{C}{2} XV_D - \tag{13}$$

$$j\omega \frac{C}{2} X\left( V_D - (j\omega L + r)X \cdot \left( I_D - j\omega \frac{C}{2} XV_D \right)\right)$$

In the equation (13), rearranging the equation (13) by omitting the terms including $X^2$ or more, we have the equation (14) corresponding to the equations (6) and (7).

$$I_f \approx \lambda(I_D - j\omega CXV_D)e^{j\theta} \tag{14}$$

where $\lambda = |1 + I_{DRf}/I_{DSf}|$ and $\theta = \arg(1 + I_{DRf}/I_{DSf})$. The voltage $V_f$ at the assumed fault point f is expressed by the following equation (15).

$$V_f = V - (j\omega L + r)X \left( I - j\omega \frac{C}{2} XV \right) \tag{15}$$

Rewriting the equation (15) by omitting the terms including $X^2$ or more, we have the equation (8).

Figure 8:
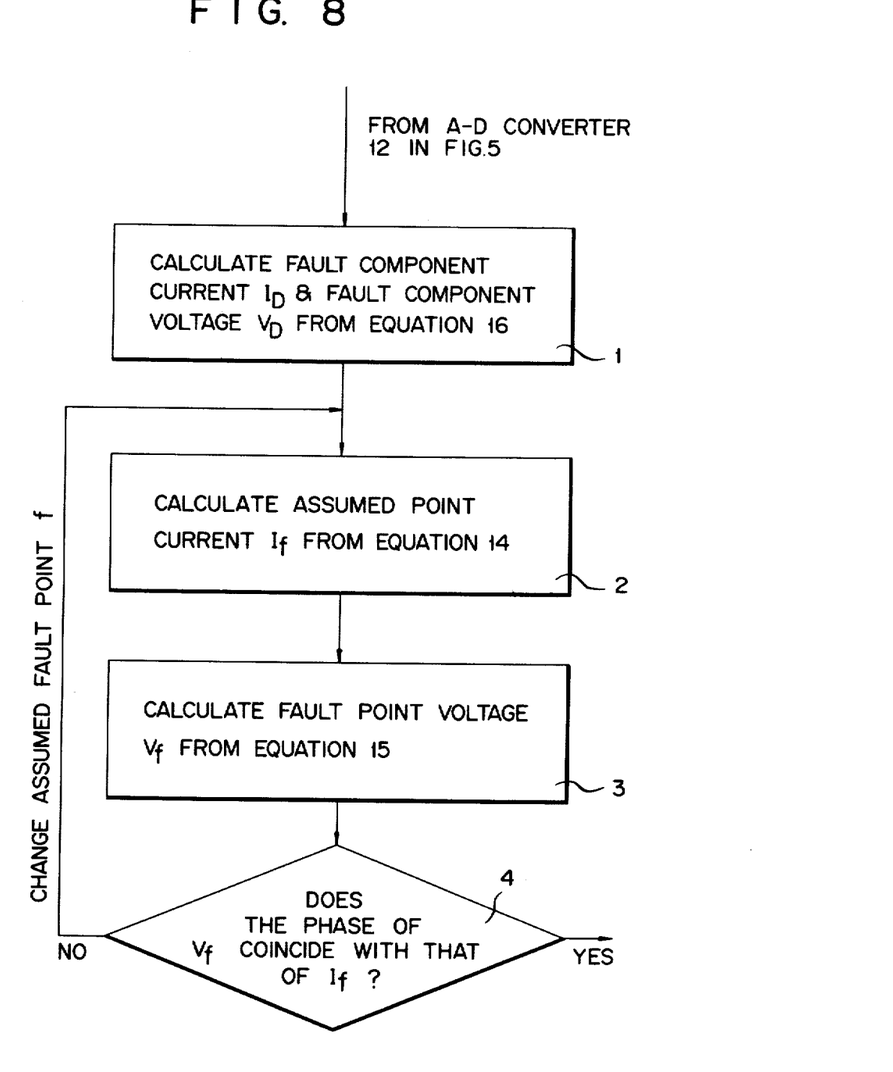
FIGS. 8 through 10 show flow charts useful in explaining the another embodiment according to the invention.

Turning now to FIG. 8, there is shown a flow chart illustrating a second embodiment of the invention to obtain a distance X (distance from end S of the protective section) at the fault point by using the equations (10) to (15) when the distributed capacitances are taken into account. In FIG. 8, a step 1 calculates a first fault component current $I_D$ and a fault component voltage $V_D$ by using the following equation (16).

$$I_D = I - I_A \atop V_D = V - V_A \Bigg\} \tag{16}$$

Then, a step 2 calculates a current in phase with an assumed fault point current $I_f$ by using the equation (14). A step (3) calculates $V_f$ of the assumed fault point voltage by the equation (15). A step 4 checks as to if the assumed fault point current $I_f$ obtained in the step 2 and the assumed fault point voltage $V_f$ obtained in the step 3 are in phase or not. If those are in phase, the operation of the steps 2 and 3 is completed, it returns to the step 2 to change the assumed fault point f and to again perform the steps 2 and 3. Through this operation, an actual or true fault point F is obtained. The above-mentioned second embodiment is also applicable for a case where the distributed capacitances of the transmission line is distinctive, in order to obtain the fault point F.

Figure 9A:
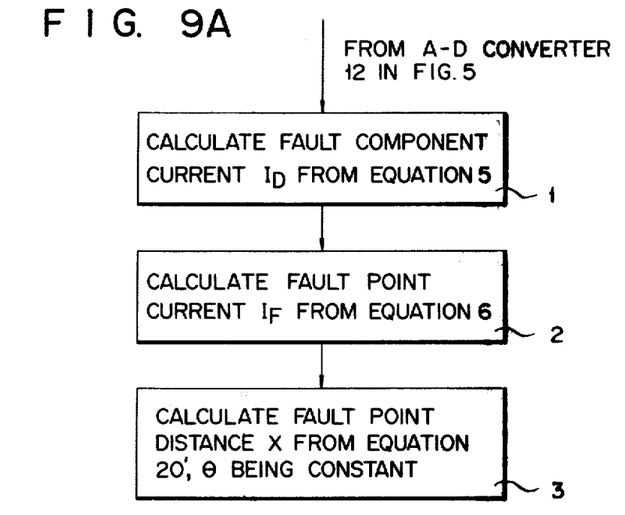

FIG. 9A shows a flow chart of a third embodiment according to the invention. In this embodiment, the phase difference $\theta$ in the equation (7) is approximately zero, and thus the calculation is made with an assumption that $\theta$ is zero. In this way, the fault point F is obtained by a single calculation, not a plurality of calculations for a plurality of the assumed fault points f. Accordingly, in this embodiment, the calculation is completed for a shorter time. Further, the third embodiment is applicable for a case where the distributed capacitance is not negligible.

In the flow chart, in FIG. 9A, a step 1 calculates the fault component current $I_D$ by using the equation (5), as in the step 2 of FIG. 3. A step 2 calculates a current in phase with the fault point current $I_F$, as in the step 2 of FIG. 3. The step 3 calculates a distance X (distance from the end S) at the assumed fault point f with a voltage $V_f$ which is in phase with the fault point current $I_F$ obtained in the step 2 by using an equation (20') (later described). It is recognized that the fault point F is located at the distance X. The 3rd step corresponds to a combination of the steps 3 and 4 shown in FIG. 3.

The calculation of the distance X is made in the following manner. With $\theta \approx 0$, from the equations (7), (8) and (9), we have the following equation $$\{V - I(j\omega L + r)X\}/I_D = \text{a real number} \tag{17}$$

By multiplying the numerator and the denominator of the equation (17) by a conjugate complex number $I_D^*$ of the $I_D$ (hereinafter, * attached indicates the conjugate complex number), we have denominator of a real number, and the following equation (18)

$$\{V - I(j\omega L + r)X\}I_D^* = \text{a real number} \tag{18}$$

Hence, we have the following equation (19)

$$Im[\{V - I(j\omega L + r)X\}I_D^*] = 0 \tag{19}$$

In the equation (19), Im indicates an imaginary part. Accordingly, the distance X is calculated from the following equation (20)

$$X = Im(VI_D^*)/Im\{I(j\omega L + r)I_D^*\} \tag{20}$$

The step 3 in FIG. 9A algebraically calculates the distance X by using the equation (20') to be described later.

Figure 9B:
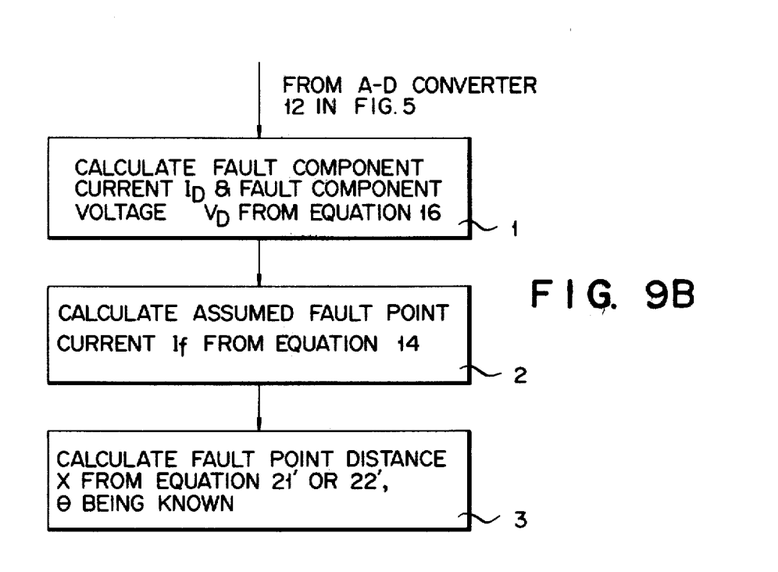

FIG. 9B shows a flow chart of a fourth embodiment according to the invention, which corresponds to the third embodiment shown in FIG. 9A when the distributed capacitance shown in FIG. 6 is taken into account. In FIG. 9B, a step 1 calculates the current $I_D$ and the voltage $V_D$ by using the equation (16). In the step 2, a current in phase with the assumed fault point current $I_f$ is calculated by (14) with $\theta \approx 0$. In a step 3, a distance X of the fault point is calculated by equation (21') or (22'), with $\theta \approx 0$. When the distributed capacitance is taken into account, the following equations (21) and (22) hold $$Im[\{V - I(j\omega L + r)X\}(I_D - j\omega CXV_D)^*] = 0 \tag{21}$$

$$Im[X^2 I(j\omega L + r)(j\omega CXV_D) - X\{I(j\omega L + r)I_D^* + V(j\omega CXV_D)^*\} + VI_D^*] = 0 \tag{22}$$

The equation (22) is a quadratic equation of X and therefore X can be obtained in a known manner.

In the equations (17) to (22), $\theta$ in the equation (7) or (14) is handled on the assumption that it is approximately 0. However, it is satisfied that $\theta$ is almost constant and it is not necessarily zero. If $\theta$ is an almost fixed value, the equations (19) to (22) become (19') to (22'), respectively. Those latter equations also provide X.

$$Im[\{V - I(j\omega L + r)X\}(I_D e^{j\theta})^*] = 0 \tag{19'}$$

$$X = Im(VI_D^* \epsilon^{-j\theta})/Im\{I(j\omega L + r)I_D^* \epsilon^{-j\theta}\} \tag{20'}$$

$$Im[\{V - I(j\omega L + r)X\}\{(I_D - j\omega CXV_D)e^{j\theta}\}^*] = 0 \tag{21'}$$

$$Im[X^2 I(j\omega L + r)(j\omega CXV_D e^{j\theta})^* - X\{I(j\omega L + r)\cdot(I_D e^{j\theta})^* + V(j\omega CXV_D e^{j\theta})^*\} + V(I_D e^{j\theta})^*] = 0 \tag{22''}$$

Figure 10:
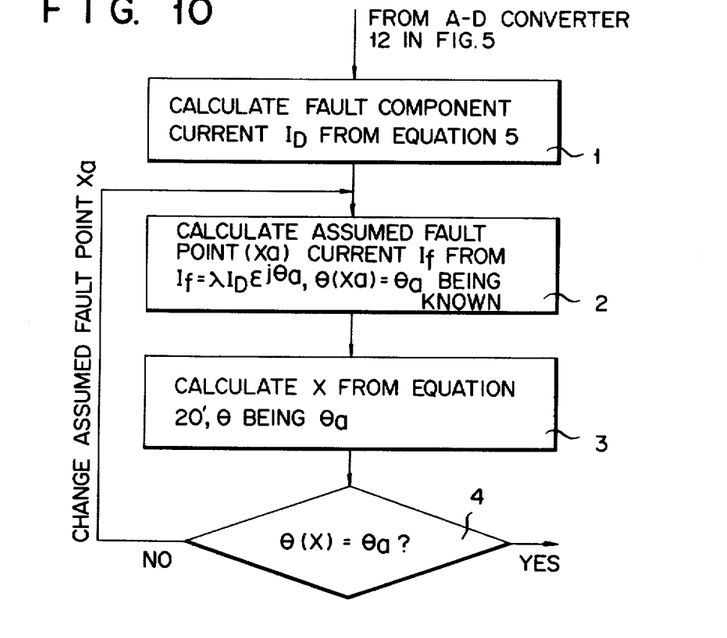

FIG. 10 shows a flow chart of a fifth embodiment according to the invention. In the flow chart, a step 1 calculates the fault component current $I_D$ by the equation (5). A step 2 calculates the assumed fault point current $I_f$ by using the equation $I_f = \lambda I_D e^{j\theta_a}$ corresponding to the equation (6). In a step 3, a distance (distance from the end S of the protective section) of the fault point F is calculated. In the case of FIG. 9A, calculation is performed on the assumption that $\theta$ is approximately constant over the entire of the transmission line (see equation (20')). In the embodiment, shown in FIG. 10, $\theta$ is not necessarily constant over the entire range of the transmission line. Normally, $\theta$ is not constant over the entire transmission line, but in general it is not sensitive to a fault point. Therefore, if a range of the transmission line having a fault occurring at any location is limited to a specific range, $\theta$ may be assumed to be approximately constant in many cases. In FIG. 10, it is assumed at first that the fault point X is located at a point Xa present within a given range over the transmission line. Further assume that a known $\theta$ of the fault point is $\theta_a$. With this $\theta_a$, X is calculated by using the equation (20') in the step 3. A step 4 judges as to if the $\theta_a$ assumed and a known $\theta(X)$ in the point Xa are almost equal to each other or not. If those are almost equal ("YES"), the operation of the respective steps is completed. On the other hand, if those are not in such a state ("NO"), the operation returns to the step 2, the point Xa is replaced by a new one Xa, the steps 2 and 3 are performed. The fault point thus obtained is an actual fault point. The embodiment shown in FIG. 10 is applicable for a case where the $\theta$ in the equation (20') is not necessarily constant over the entire transmission line, and may shorten the calculation time as in the case of FIG. 9A.

In the first to fifth embodiments, the transmission line used is a single-phase transmission line. However, the invention is applicable for a three-phase transmission line if the line voltage and the line current are used for the voltage and current in the case of shortcircuit fault in the three-phase transmission line. The above-mentioned embodiments of the invention are all applicable for a fault of one line grounding of the three-phase transmission line, if a known mode conversion technique is used. Since the mode conversion technique is publicly known, the detail of it will be omitted. An explanation will be briefed of an equivalent circuit shown in FIG. 11 when a $(\alpha, \beta, 0)$ method at the time of one-line grounding.

Figure 11:
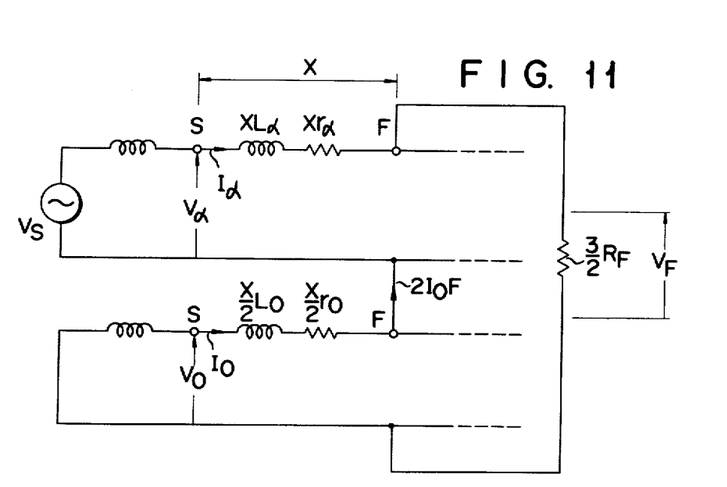
FIG. 11 shows an equivalent circuit for illustrating an example when the invention is applied for a three-phase power transmission line.

FIG. 11 shows symbols $V_S$, S, and F designate the corresponding ones shown in FIG. 1, and $V_\alpha$, $V_0$, $I_\alpha$ and $I_0$ are an $\alpha$ mode voltage, a 0 mode voltage, an $\alpha$ mode current, and a 0 mode current at terminal S, respectively. $L_\alpha$, $r_\alpha$, $L_0$ and $r_0$ are an $\alpha$ mode inductance, an $\alpha$ mode resistance, a 0 mode inductance and a 0 mode resistance, respectively. Further, S designates a distance from end S to a fault point F, and $R_F$ designates a fault point resistance. When an equation corresponding to the equation (19), for example, is obtained from FIG. 11, it is expressed by $$Im[\{V_\alpha + V_0 - I_\alpha(j\omega L + r_\alpha)X - I_0(j\omega L_0 + r_0)X\cdot\}I_{D\alpha}^*] = 0 \qquad (23)$$

where $I_{D\alpha}^*$ is the conjugate complex number of $I_{D\alpha}$, $I_{D\alpha}$ is a fault component current of $I_\alpha$. The $I_{D\alpha}$ is not illustrated in FIG. 11 but it is equivalent to the current $I_D$ in each of the embodiments.

What we claim is:

1. A method for locating a fault point on a transmission line comprising:
   a first step for detecting a prefault current (first current) at one end of said transmission line and detecting a faulted voltage and a faulted current (second current) at said one end;
   a second step for subtracting said prefault current (first current) from said faulted current (second current) to obtain a fault component current at said one end;
   a third step for shifting the phase of said fault component current by a known phase angle to obtain a third current;
   a fourth step for assuming an assumed fault point, subtracting an impedance voltage drop from said faulted voltage to obtain an assumed fault point voltage at said assumed fault point, said impedance voltage drop being a voltage drop caused by said faulted current (second current) between said one end and said assumed fault point; and
   a fifth step for discriminating whether the phase of said assumed fault point voltage coincides approximately with the phase of said third current obtained in said third step or not, changing said assumed fault point, repeating said fourth step and said discriminating step until the phase of said assumed fault point voltage coincides approximately with the phase of said third current, and determining the assumed fault point at which the phase of said assumed fault point voltage coincides approximately with the phase of said third current to be said fault point.

2. The method for locating a fault point on a transmission line according to claim 1, wherein said known phase angle in said third step is zero.

3. A method for locating a fault point on a transmission line comprising:
   a first step for detecting a prefault voltage and a prefault current (first current) at one end of said transmission line and detecting a faulted voltage and a faulted current (second current) at said one end;
   a second step for subtracting said prefault voltage from said faulted voltage to obtain a fault component voltage and subtracting said prefault current (first current) from said faulted current (second current) to obtain a first fault component current at said one end;
   a third step for assuming an assumed fault point, obtaining a second fault component current flowing into said assumed fault point through said one end from said fault component voltage and said first fault component current by using an equivalent circuit including a distributed capacity between said one end and said assumed fault point, and shifting the phase of said second fault component current by a known phase angle to obtain a third current;
   a fourth step for subtracting an impedance voltage drop from said faulted voltage to obtain an assumed fault point voltage at said assumed fault point, said impedance voltage drop being a voltage drop caused by said faulted current (second current) between said one end and said assumed fault point; and
   a fifth step for discriminating whether the phase of said assumed fault point voltage coincides approximately with the phase of said third current obtained in said third step or not, changing said assumed fault point and repeating said third step, said fourth step and said discriminating step until the phase of said assumed fault point voltage coincides approximately with the phase of said third current, and determining an assumed fault point at which the phase of said assumed fault point voltage coincides approximately with the phase of said third current to be said fault point.

4. The method for detecting a fault point on a transmission line according to claim 3, wherein said known phase angle in said third step is zero.

5. A method for locating a fault point on a transmission line comprising:
   a first step for detecting a prefault current (first current) at one end of said transmission line and detecting a faulted voltage and a faulted current (second current) at said one end;
   a second step for subtracting said prefault current (first current) from said faulted current (second current) to obtain a fault component current at said one end;
   a third step for shifting the phase of said fault component current by a known phase angle to obtain a third current;
   a fourth step for assuming a distance between said one end and said fault point to be a variable, solving an equation with respect to said variable by assuming an imaginary part of a product to be zero, said product being a product of a voltage obtained by subtracting an impedance voltage drop caused by said faulted current (second current) between said one end and said fault point from said faulted voltage and a conjugate component of said third current obtained in said third step, and determining said solved variable to be a true distance between said one end and said fault point.

6. A method for locating a fault point on a transmission line comprising:

a first step for detecting a prefault voltage and a prefault current (first current) at one end of said transmission line and detecting a faulted voltage and a fault current (second current) at said one end;

a second step for subtracting said prefault voltage from said faulted voltage to obtain a fault component voltage and subtracting said prefault current (first current) from said faulted current (second current) to obtain a first fault component current at said one end;

a third step for assuming an assumed fault point, obtaining a second fault component current flowing into said assumed fault point through said one end from said fault component voltage and said first fault component current by using an equivalent circuit including a distributed capacity between said one end and said assumed fault point, and shifting the phase of said second fault component current by a known phase angle to obtain a third current;

a fourth step for assuming a distance between said one end and said fault point to be a variable, solving an equation with respect to said variable by assuming an imaginary part of a product to be zero, said product being a product of a voltage obtained by subtracting an impedance voltage drop caused by said faulted current (second current) between said one end and said fault point from said faulted voltage and a conjugate component of said third current obtained in said third step, and determining said solved variable to be a true distance between said one end and said fault point.

7. A method for locating a fault point on a transmission line comprising:

a first step for detecting a prefault current (first current) at one end of said transmission line and detecting a faulted voltage and a faulted current (second current) at said one end;

a second step for subtracting said prefault current (first current) from said faulted current (second current) to obtain a fault component current at said one end;

a third step for assuming an assumed phase angle and shifting the phase of said fault component current by said assumed phase angle to obtain a third current;

a fourth step for assuming a distance between said one end and said fault point to be a variable, solving an equation with respect to said variable by assuming an imaginary part of a product to be zero, said product being a product of a voltage obtained by subtracting an impedance voltage drop caused by said faulted current (second current) between said one end and said fault point from said faulted voltage and a conjugate component of said third current obtained in said third step; and a fifth step for discriminating whether a resultant phase angle which is a known function of the solved variable obtained in said fourth step coincides approximately with said assumed angle or not, changing said assumed phase angle and repeating said third step, said fourth step and said descriminating step until said resultant phase angle coincides approximately with said assumed phase angle, and determining said solved variable obtained in said fourth step when said resultant phase angle coincides approximately with said assumed phase angle to be a true distance between said one end and said fault point.

* * * * *